(12) United States Patent
Obweger

(10) Patent No.: US 7,052,577 B2
(45) Date of Patent: May 30, 2006

(54) ANNULAR RECEPTACLE FOR A ROTATING CARRIER

(75) Inventor: Rainer Harald Obweger, Lind/Dr. (AT)

(73) Assignee: SEZ AG, Villach (AT)

( * ) Notice: Subject to any disclaimer, the term of this patent is extended or adjusted under 35 U.S.C. 154(b) by 366 days.

(21) Appl. No.: 10/235,316

(22) Filed: Sep. 5, 2002

(65) Prior Publication Data
US 2003/0056898 A1    Mar. 27, 2003

(30) Foreign Application Priority Data
Sep. 26, 2001    (AT) .............................. A 1518/2001

(51) Int. Cl.
*H01I 21/68* (2006.01)
*H01L 21/306* (2006.01)

(52) U.S. Cl. .................................. 156/345.55; 134/113
(58) Field of Classification Search ........... 156/345.12, 156/345.14, 345.13, 345.55; 118/730; 134/113
See application file for complete search history.

(56) References Cited

U.S. PATENT DOCUMENTS

| 4,903,717 | A | * | 2/1990 | Sumnitsch ................. 134/99.1 |
| 4,968,375 | A | * | 11/1990 | Sato et al. ............. 156/345.23 |
| 5,705,223 | A | | 1/1998 | Bunkofske ................... 427/248 |
| 6,040,011 | A | * | 3/2000 | Yudovsky et al. ...... 427/255.28 |
| 6,149,727 | A | * | 11/2000 | Yoshioka et al. ............ 118/500 |
| 6,672,318 | B1 | * | 1/2004 | Tsuchiya et al. ............ 134/147 |

FOREIGN PATENT DOCUMENTS

| DE | 198 07 460 A1 | 4/1999 |
| EP | 0 444 714 B1 | 5/1994 |
| JP | 05102028 A | * 4/1993 |

OTHER PUBLICATIONS

Partial English translation (computer generated) of DE 19807460.*

* cited by examiner

*Primary Examiner*—Parviz Hassanzadeh
*Assistant Examiner*—Sylvia R. MacArthur
(74) *Attorney, Agent, or Firm*—Kusner & Jaffe

(57) ABSTRACT

An annular receptacle is described, particularly for a rotating carrier for receiving a disk-shaped object such as a semiconductor.

14 Claims, 1 Drawing Sheet

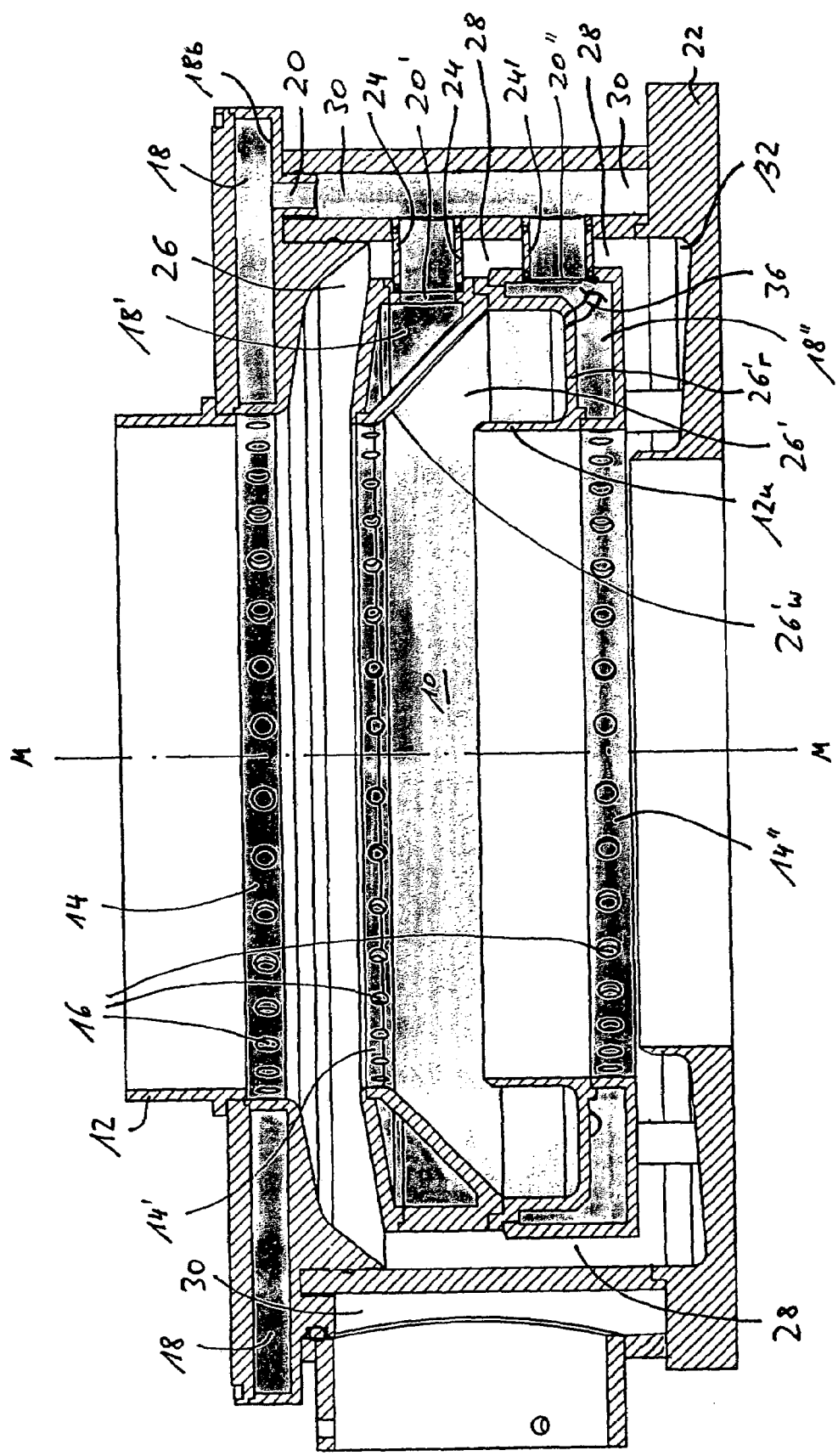

ANNULAR RECEPTACLE FOR A ROTATING CARRIER

FIELD OF THE INVENTION

The present invention relates to an annular receptacle, particularly for a rotating carrier for receiving a disk-shaped object such as a semiconductor. Insofar as semiconductors or wafers are mentioned in the following, this concept includes all types of disk-shaped objects such as CDs or magnetic disks

BACKGROUND OF THE INVENTION

For processing disk-shaped semiconductors, for example for etching silicon disks (wafers), possibly using different acids, positioning the semiconductor on a rotating carrier (chuck) is known. A treatment liquid, for example an acid, is applied to the surface of the semiconductor to be treated. The etching liquid distributes itself over this surface due to the rotational movement of the semiconductor and is accelerated laterally (radially) over the edge of the semiconductor.

For catching this treatment liquid, it is suggested, in European Patent 0 444 714 B1, that at least two ring channels, which are open to the inside of the receptacle, be provided in the annular receptacle (pot) for collecting the treatment liquid. In other words: the ring channels are used for the purpose of catching thrown-off processing liquid. Accordingly, the ring channels are arranged in the receptacle in a radial extension of the semiconductor to be treated. In German Patent Application 198 07 460 A1, an annular receptacle of this species is described which has, in addition to the annular channel, via which the treatment liquid is removed, at least one suction device. The basic idea of this known solution is to suction off the processing air (processing gas) located in the system (the facility) separately from the radial absorption of thrown-off processing liquid.

However, due to the essentially rotationally symmetric construction of the receptacle, the problem of non-uniform suction performance results if, as suggested in German Patent Application 198 07 460 A1, the processing air collected in the ring channel is suctioned off via a radially running connection line. In addition, the known receptacle is relatively large. Space problems result from this in clean rooms, where these types of devices are installed. The space necessary for a device is a not insignificant influencing dimension for the overall production costs.

Finally, the known device requires, due to differing pressure ratios (considered over the circumference of the device), a relatively high suction power which may, for example, be up to 1000 m³/h for wafers having a diameter of 30 cm.

The present invention therefore has the object of constructively optimizing a device (receptacle) of the type described in order to fulfill at least one, preferably all, of the following criteria:

The device is to be as small as possible for a defined size of the objects to be treated,
  pressure conditions which are as uniform as possible (considered around the circumference of the device) are to be sought in regard to the respective suction device,
  the necessary suction power is to be as low as possible for reasons of cost,
  separation of different treatment media, including the respective processing atmosphere, which is as precise as possible is to be sought.

To achieve these and further parts of the object, which result from the remaining application documents, the present invention is based on the following basic consideration: in an essentially rotationally symmetric component, such as a receptacle according to the species, uniform pressure ratios may not be achieved in the receptacle with a more or less punctually acting partial vacuum source if the individual supply lines discharge directly into a joint peripheral channel, which the suction line leads away from.

In contrast, the pressure ratios are greatly improved if the atmosphere to be removed is initially led into a suction chamber and from there into a pressure distribution chamber, to which a suction line is connected.

The advantages connected with this are particularly clear in "multistory receptacles", i.e., devices in which the carrier for the object to be treated is vertically displaceable and different treatment processes are performed at various vertical heights. Thus, for example, in one step a wafer may be etched, and in another step the wafer surface may be washed using deionized water. In this case, annular channels corresponding to each treatment step are assigned, via which the respective processing liquid may be removed. Each annular channel is then in turn assigned a suction device, which is implemented in the way described in the preceding and following. Multiple suction devices preferably discharge into one and the same pressure distribution chamber, which causes the suction power to even out, the corresponding partial vacuum able to occur via a central suction line, as in the related art.

SUMMARY OF THE INVENTION

Therefore, the present invention, in its most general embodiment, relates to an annular receptacle for a rotating carrier for receiving a disk-shaped object having the following features:

The receptacle has at least one annular channel in the radial extension of a supporting surface of the carrier for the object,
  neighboring at least one annular channel, at least one suction device runs in the receptacle starting from its inner wall,
  the suction device includes suction openings positioned in the region of the inner wall and an annular suction chamber radially adjoining the suction end of the suction openings,
  at least one pressure distribution chamber connects a suction line to the suction chamber.

Like the objects to be treated, for example, wafers, the device is also essentially rotationally symmetric "Essentially rotationally symmetric" means, in this case, that (with the exception of the central suction line) the remaining parts of the device are arranged distributed essentially uniformly around a central lengthwise axis of the device.

Corresponding to the annular channels, via which thrown off processing liquid may be guided away, the suction openings are also, for example, positioned along a ring surface which may be a direct component of the inner wall of the receptacle. The suction openings may run above and/or below the associated annular channel(s), as is explained in more detail with reference to the following description of figures. The suction openings may be simple holes (bores), but may also be designed like suction nozzles. Suction slots may also be provided.

The suction chamber connected downstream from the suction openings in the flow direction may adjoin directly to the suction openings radially on the outside in a horizontal plane. However, according to one embodiment, at least one suction chamber runs, starting from the inner wall of the receptacle, sloping down outward and/or in relation to the supporting surface of an associated carrier.

From the suction chamber, the gas suctioned off reaches the connected pressure distribution chamber via a "baffle" (a location tapered in cross-section).

The suction chamber may be connected to the pressure distribution chamber via discrete openings. In other words: like the suction openings between the inner chamber of the receptacle and the suction chamber, the connections between the suction chamber and the pressure distribution chamber adjoining it in the flow direction may be designed essentially as desired.

In order to optimize evening out of the pressure ratios, however, a rotationally symmetric arrangement of the openings between the suction chamber and the pressure distribution chamber suggests itself.

In a receptacle having multiple annular channels running over one another in the receptacle and suction devices assigned to them, one embodiment provides that at least two suction devices, possibly even all suction devices, are connected to the same pressure distribution chamber. In this way, the processing gases concerned are suctioned off separately into different suction chambers in individual "stories" of the device, but are subsequently fed from there to a joint pressure distribution chamber, so that as a whole essentially isotropic pressure ratios result over the entire facility.

In this case, it suggests itself, as will be explained in the description of the figures, that the pressure distribution chamber be implemented as a peripheral chamber having a relatively low width which extends, however, essentially over the entire height of the receptacle.

Outlet lines may be connected to the individual channels, via which the processing liquid is guided away. Alternatively, this may be performed in such away that the processing liquid is subsequently recirculated, i.e., returned to a spraying device above the disk-shaped object, for example.

In this case, multiple annular channels may be connected to a joint outlet line, particularly if identical or compatible liquids are guided away via the corresponding channels.

The construction described allows the suction power to be reduced by up to 75% in relation to comparable devices according to the related art. This is particularly a consequence of evening out the pressure ratios and the optimization of the air conduction. In addition, the receptacle may be designed compactly and requires very little space. For example, for treating wafers having a diameter of 30 cm, external diameter of the device may be restricted to approximately 60 cm or less.

Further features of the present invention result from the features of the dependent claims and the other application documents.

BRIEF DESCRIPTION OF THE DRAWINGS

The present invention is described in more detail in the following with reference to an exemplary embodiment. The sole FIGURE shows a longitudinal section through an annular (pot-shaped) multistage receptacle, without a carrier for the object to be treated, because this is related art and may, for example, be taken from German Patent Application 198 07 460 A1.

DETAILED DESCRIPTION OF PREFERRED EMBODIMENT

The receptacle has a cylindrical inner chamber 10, which is delimited by an inner wall 12 of the receptacle. A carrier (not shown) is positioned so it is vertically adjustable in inner chamber 10. The object to be treated lies flat on the carrier.

A first ring zone 14 having suction openings 16, to which a corresponding suction chamber 18 is peripherally (radially) connected, is located in the region of inner wall 12. Openings 20 distributed rotationally symmetrically are positioned in floor 18b of suction chamber 18, which discharge into a pressure distribution chamber, which runs concentrically to central lengthwise axis M of the device and which has a height (parallel to central lengthwise axis M) multiple times greater than the chamber width (channel width). Pressure distribution chamber 30 is delimited on the lower end by a floor plate 22.

A further ring zone 14', which is constructed analogously to ring zone 14, is provided at a distance below (upper) ring zone 14. A ring chamber 18' adjoins the outside of this ring zone 14'. While ring chamber 18 adjoins ring zone 14 in a horizontal plane, suction chamber 18' slopes downward and outward, starting from ring zone 14'. In this case, an approximately triangular cross-sectional profile results, having an essentially vertical external wall in which openings 20' are positioned, distributed around the circumference, to which tubular spacers 24 adjoin radially outward in order to provide a through connection from suction chamber 18' to pressure distribution chamber 30.

An annular channel 26, which adjoins cylindrical inner chamber 10 radially outward and essentially runs between suction chambers 18, 18', is simultaneously delimited between ring zones 14, 14'.

On the outside, annular channel 26 turns into a channel 28, running parallel to pressure distribution chamber 30, which discharges into a type of floor groove 32, which a hose line 34 leads away from.

As may be seen in the FIGURE, spacers 24 run transversely through channel 28 without, however, impairing the vertical flowability of channel 28.

A further ring zone 14", which is again designed essentially analogously to ring zones 14, 14', runs at a distance below ring zone 14'. Similarly to ring zone 14, a suction chamber 18" adjoins on the outside, whose peripheral wall surfaces have openings 20" to which spacers 24' adjoin (as on openings 20'), which provide a flow connection between suction chamber 18" and pressure distribution chamber 30.

A further channel 26' is implemented, between ring zones 14', 14", which, in addition to a slanted upper wall 26'w, includes a lower, trough-like, peripheral part 26'r, which a spur line 36 leads away from.

Section 26'r is delimited on the inside by a part 12u of inner wall 12.

The device functions, for example, as follows:

A carrier having a wafer is guided to a position between ring zones 14', 14" and driven so it rotates. The wafer is treated from above using an etching liquid which is thrown off outward into channel 26' and guided away via spur line 36. Simultaneously, the processing air is suctioned off via ring zone 14' via suction, chamber 18' and spacers 24 into pressure distribution chamber 30 which, as illustrated in the left part of the FIGURE, is connected to a central suction line 38.

Simultaneously, suctioning may also be performed via further ring zones 14, 14", the entire processing air (although in different ways) discharges into pressure distribution chamber 30 as a result and is drawn off from there via suction line 38.

After this processing step, the carrier may be raised and brought into a position between ring zones 14, 14'. It may, for example, be treated here using deionized water which is accelerated around the circumference into channel 26, where it runs via channel 28 into floor trough 32 and is drawn off there via a hose line (not shown).

A further reduction of the size of the device may be achieved through the essentially parallel arrangement of pressure distribution chamber 30 (outlet line for gaseous media) and channel 28 (for guiding away a processing liquid).

The invention claimed is:

1. An annular receptacle for receiving a rotating carrier that receives a disk-shaped object, said annular receptacle comprising:
   at least one annular channel (26, 26') in the radial extension of a supporting surface of the carrier for the object, wherein said at least one annular channel is operable to guide a liquid away from said object, said receptacle having a central lengthwise axis,
   at least one annular suction device neighboring the at least one annular channel (26, 26'), starting from an inner wall (12) of said receptacle, wherein the at least one suction device includes:
   (a) suction openings (16) to draw gas away from the object, said suction openings radially spaced from the central lengthwise axis in the region of the inner wall (12), and
   (b) annular suction chamber (18, 18', 18") radially adjoining the suction end of the suction openings (16),
   wherein said rotating carrier rotates the object relative to the at least one suction device that remains stationary,
   a pressure distribution chamber (30) in fluid communication with a suction line (38) and the suction chamber (18, 18', 18").

2. The receptacle according to claim 1, wherein the suction openings (16) are located above the annular channel (26, 26').

3. The receptacle according to claim 1, wherein the suction openings (16) comprise multiple suction nozzles distributed uniformly along the inner wall (12) of the receptacle.

4. The receptacle according to claim 1, wherein the suction openings (16) are positioned on a ring surface (14, 14', 14").

5. The receptacle according to claim 1, wherein said receptacle includes discrete openings (20, 20', 20") for connecting the suction chamber (18, 18', 18") to the pressure distribution chamber (30).

6. The receptacle according to claim 1 having multiple annular channels (26, 26'), located one above the other in the receptacle, and a respective suction device associated with each annular channel, at least two suction devices in fluid communication with said pressure distribution chamber (30).

7. The receptacle according to claim 1, wherein the suction chamber (18') of at least one suction device slopes downward in relation to the supporting surface of the carrier, starting from the inner wall (12) of the receptacle.

8. The receptacle according to claim 1 having an outlet line (36), connected to an annular channel (26, 26'), which is alternatively returned to a spraying device above the disk-shaped object.

9. The receptacle according to claim 8, wherein multiple annular channels (26, 26') are connected to a joint outlet line.

10. The receptacle according to claim 1, wherein the pressure distribution chamber (30) has a relatively small width, and extends substantially the entire height of the receptacle.

11. The receptacle according to claim 1, wherein said inner wall is coaxial with said pressure distribution chamber.

12. The receptacle according to claim 1, wherein said at least one annular channel is coaxial with said pressure distribution chamber.

13. The receptacle according to claim 1, wherein said suction openings have axes transverse to said central lengthwise axis.

14. The receptacle according to claim 1, wherein the suction openings of at least one of said annular suction devices is located vertically above said at least one annular channel.

* * * * *